United States Patent
Masuda et al.

(10) Patent No.: US 12,516,437 B2
(45) Date of Patent: Jan. 6, 2026

(54) METHOD OF PLATING AND APPARATUS FOR PLATING

(71) Applicant: EBARA CORPORATION, Tokyo (JP)

(72) Inventors: Yasuyuki Masuda, Tokyo (JP); Yohei Wakuda, Tokyo (JP); Masashi Shimoyama, Tokyo (JP); Mizuki Nagai, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 433 days.

(21) Appl. No.: 17/923,567

(22) PCT Filed: Oct. 18, 2021

(86) PCT No.: PCT/JP2021/038404
§ 371 (c)(1),
(2) Date: Nov. 4, 2022

(87) PCT Pub. No.: WO2023/067650
PCT Pub. Date: Apr. 27, 2023

(65) Prior Publication Data
US 2025/0075364 A1    Mar. 6, 2025

(51) Int. Cl.
*C25D 17/06* (2006.01)
*C25D 5/48* (2006.01)
(Continued)

(52) U.S. Cl.
CPC ............... *C25D 17/06* (2013.01); *C25D 5/48* (2013.01); *C25D 17/004* (2013.01);
(Continued)

(58) Field of Classification Search
None
See application file for complete search history.

(56) References Cited

U.S. PATENT DOCUMENTS

| | | | |
|---|---|---|---|
| 7,138,039 B2* | 11/2006 | Burkhart | C25D 17/06 204/297.08 |
| 2004/0140199 A1* | 7/2004 | Mizohata | C25D 17/001 257/E21.175 |

(Continued)

FOREIGN PATENT DOCUMENTS

| JP | 2002-332597 A | 11/2002 |
|---|---|---|
| JP | 2003-027288 A | 1/2003 |

(Continued)

*Primary Examiner* — Louis J Rufo
(74) *Attorney, Agent, or Firm* — BakerHostetler

(57) ABSTRACT

One object of the present disclosure is to provide a technique of suppressing deterioration of a seed layer of a substrate. There is provided a method of plating, comprising: a process of holding a substrate by a substrate holder, such that a sealed space is formed to protect a contact provided to supply electricity to the substrate, from a plating solution while the substrate holder holds the substrate, and that a contact location between the substrate and the contact is locally covered with a liquid in the sealed space; a process of soaking the substrate held by the substrate holder in the plating solution and placing the substrate to be opposed to an anode; and a process of performing a plating process of the substrate with supplying electric current between the substrate and the anode, in a state that the contact location between the substrate and the contact is covered with a liquid.

8 Claims, 10 Drawing Sheets

(51) Int. Cl.
*C25D 17/00* (2006.01)
*C25D 17/02* (2006.01)
*C25D 21/08* (2006.01)
*C25D 21/12* (2006.01)

(52) U.S. Cl.
CPC .......... *C25D 17/005* (2013.01); *C25D 17/02* (2013.01); *C25D 21/08* (2013.01); *C25D 21/12* (2013.01); *C25D 17/001* (2013.01)

(56) References Cited

U.S. PATENT DOCUMENTS

| | | | |
|---|---|---|---|
| 2004/0140203 A1* | 7/2004 | Burkhart | C25D 7/123 204/297.01 |
| 2014/0314957 A1* | 10/2014 | Minami | B08B 3/047 427/352 |
| 2018/0171501 A1* | 6/2018 | Masuda | H01L 21/288 |
| 2021/0262108 A1 | 8/2021 | Satake | |
| 2023/0152077 A1 | 5/2023 | Seki et al. | |

FOREIGN PATENT DOCUMENTS

| | | |
|---|---|---|
| JP | 2004-225089 A | 8/2004 |
| JP | 2007-119820 A | 5/2007 |
| JP | 2018-104799 A | 7/2018 |
| JP | 2018-145524 A | 9/2018 |
| JP | 2020-100875 A | 7/2020 |
| JP | 6936422 B1 | 9/2021 |
| KR | 2021-0106346 A | 8/2021 |

\* cited by examiner

| Volume of Liquid / 4 Fingers | 0mL | 0.1mL | 0.2mL | 0.3mL | 0.4mL |
|---|---|---|---|---|---|
| H / mm | - | 0.8 | 1.2 | 1.5 | 1.7 |
| Volume of Liquid / Wafer | 0mL(Dry) | 6.5mL | 13mL | 19.5mL | 26mL |
| Appearance | ○ | × | ○ | ○ | ○ |

| Electric Conductivity | Prior to Plating | 1uS/cm | 10uS/cm | 30uS/cm | 50uS/cm | 60uS/cm | 80uS/cm | 100uS/cm | >100uS/cm |
|---|---|---|---|---|---|---|---|---|---|
| Appearance | ○ | ○ | ○ | ○ | ○ | △ | × | × | × |
| U% | – | 1.31 | 1.29 | 1.29 | 1.18 | 1.29 | 1.42 | 1.66 | 2.19 |

METHOD OF PLATING AND APPARATUS FOR PLATING

TECHNICAL FIELD

The present disclosure relates to a method of plating and an apparatus for plating.

BACKGROUND ART

A known example of a plating apparatus that performs a plating process of a substrate is a cup-type plating apparatus as described in Japanese Unexamined Patent Publication No. 2004-225089 (Patent Document 1). This plating apparatus includes a plating tank configured to store a plating solution therein and provided with an anode placed therein; and a substrate holder (also called a plating head) placed above the anode and configured to hold a substrate serving as a cathode. This substrate holder is provided with a plurality of contacts that come into contact with a contact area on an outer peripheral portion of a wafer (substrate) and supply electricity, and with a sealing configured to shield the plurality of contacts from the plating solution.

In a substrate holding structure described in Japanese Unexamined Patent Publication No. 2003-27288 (Patent Document 2), each contact is surrounded by a sealing member in a cylindrical shape, and inside of the sealing member is filled with a conductive liquid free from metal ions. This enables air bubbles to be readily removed from clearances of the sealing members in the cylindrical shape and suppresses crystals of the plating solution from depositing on the contacts.

RELATED ART DOCUMENT

Patent Document

Patent Document 1: Japanese Unexamined Patent Publication No. 2004-225089
Patent Document 2: Japanese Unexamined Patent Publication No. 2003-27288

SUMMARY OF INVENTION

Technical Problem

In the case where a substrate is transferred to the plating tank after the substrate is subjected to a pre-process such as a pre-wet process in a separate unit, an area of the outer peripheral portion of the substrate that is in contact with the contacts (contact area) is in a wet state. A plating process performed after the contact area of the substrate is dried is likely to dry even a pattern on the outer peripheral portion of the substrate and to cause a plating failure. More specifically, when the contact area of the substrate is dried, water is drained even from inside of peripheral openings of the pattern. This is likely to cause air bubbles to remain inside of the openings of the pattern in the course of plating and to cause a problem that locations of the air bubbles are not plated.

In the case where a plating process is performed in a state that dirt adheres to the surface of a contact or where a plating solution leaked out from a clearance of a component of the substrate holder adheres to the vicinity of a contact location between the substrate and the contact, a seed layer in the vicinity of the contact location is likely to be dissolved. This is likely to cause a variation in supply of electricity and to lower the in-plane uniformity of the thickness of the plating film. Furthermore, a plating process performed in the state that the contacts are not fully dried (i.e., the contacts are partly wet) after cleaning of the contacts is likely to damage a seed layer on the substrate.

In the substrate holding structure described in Japanese Unexamined Patent Publication No. 2003-27288 (Patent Document 2), inside of the sealing member in the cylindrical shape provided for each contact is filled with the conductive liquid. It is thought that this configuration is less problematic even in the case where the wet substrate comes into contact with the contact. This configuration, however, requires the sealing member in the cylindrical shape to be placed for each contact and requires the conductive liquid to be supplied into each sealing member in the cylindrical shape.

By taking into account the foregoing, one object of the present disclosure is to provide a technique of suppressing deterioration of a seed layer of a substrate in a plating process by a simple configuration.

Solution to Problem

According to one aspect, there is provided a method of plating, comprising: a process of holding a substrate by a substrate holder, such that a sealed space is formed to protect a contact provided to supply electricity to the substrate, from a plating solution while the substrate holder holds the substrate, and that a contact location between the substrate and the contact is locally covered with a liquid in the sealed space; a process of soaking the substrate held by the substrate holder in the plating solution and placing the substrate to be opposed to an anode; and a process of performing a plating process of the substrate with supplying electric current between the substrate and the anode, in a state that the contact location between the substrate and the contact is covered with a liquid.

DESCRIPTION OF EMBODIMENTS

Figure 1:
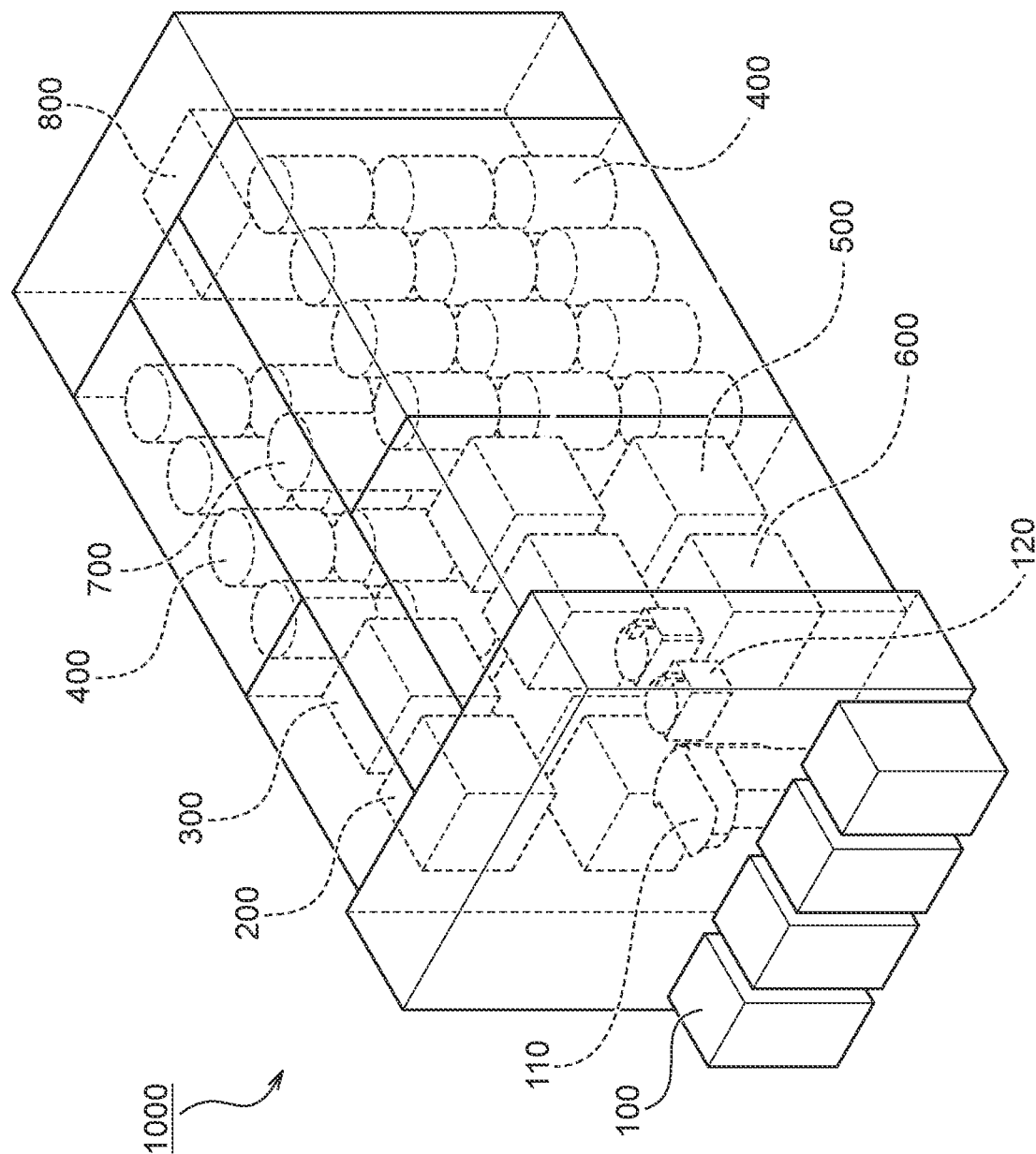
FIG. 1 is a perspective view illustrating the overall configuration of a plating apparatus according to one embodiment.

The following describes a plating apparatus 1000 and a plating method according to one embodiment of the present disclosure with reference to drawings. The drawings are schematically illustrated, in order to facilitate understanding the features of substances. The ratio of dimensions of respective components and the like in the drawings may not be equal to those in the actual state. Cartesian coordinates X-Y-Z are illustrated in some of the drawings for the purpose of reference. In the Cartesian coordinates, a Z direction corresponds to an upward direction, and a −Z direction corresponds to a downward direction (direction where the gravity acts).

Figure 2:
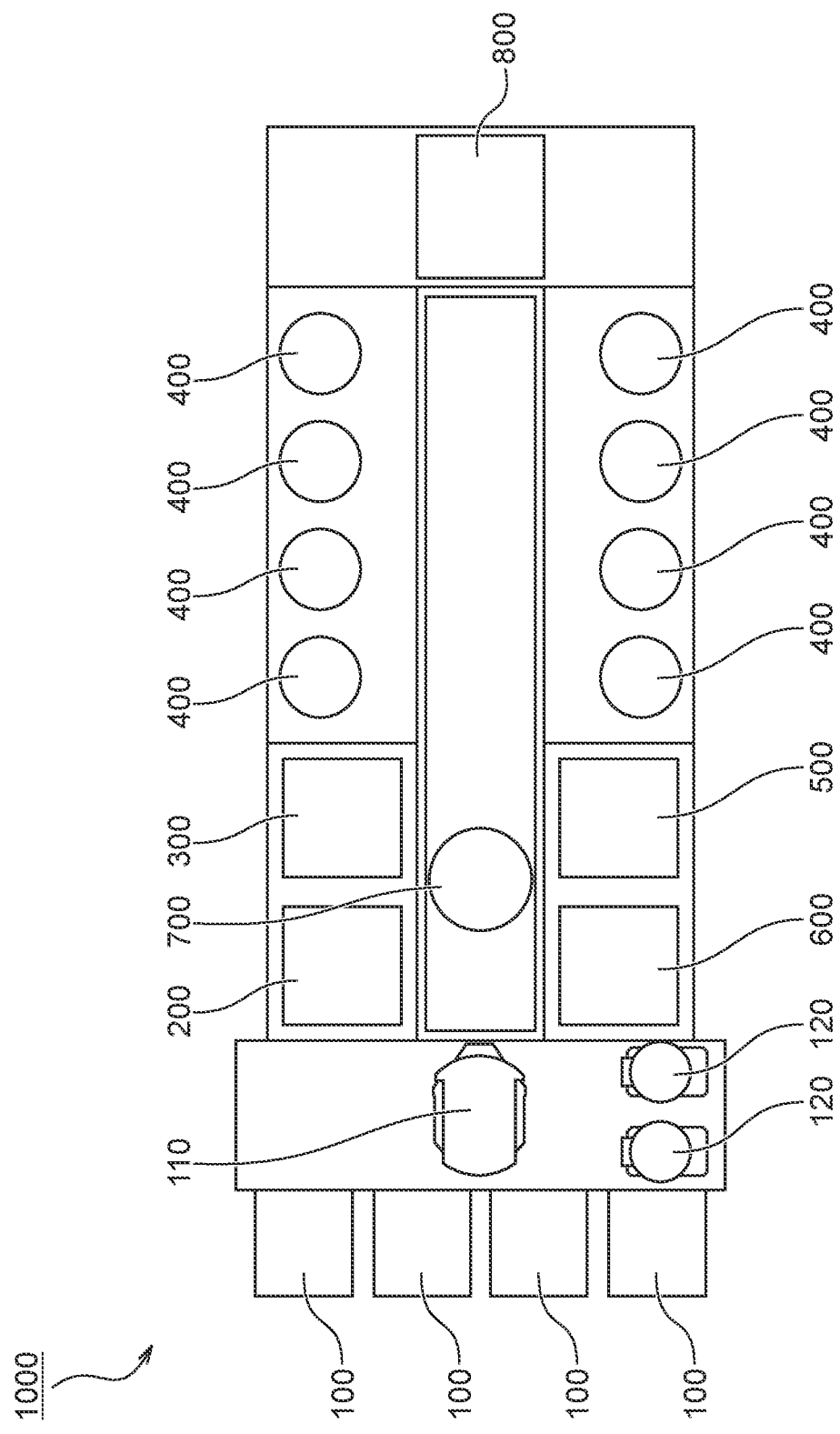
FIG. 2 is a plan view illustrating the overall configuration of the plating apparatus according to the embodiment.

FIG. 1 is a perspective view illustrating the overall configuration of the plating apparatus of this embodiment. FIG. 2 is a plan view illustrating the overall configuration of the plating apparatus of this embodiment. As illustrated in FIGS. 1 and 2, a plating apparatus 1000 includes load ports 100, a transfer robot 110, aligners 120, pre-wet modules 200, pre-soak modules 300, plating modules 400, cleaning modules 500, spin rinse dryers 600, a transfer device 700, and a control module 800.

The load port 100 is a module for loading a substrate housed in a cassette, such as a FOUP, (not illustrated) to the plating apparatus 1000 and unloading the substrate from the plating apparatus 1000 to the cassette. While the four load ports 100 are arranged in the horizontal direction in this embodiment, the number of load ports 100 and arrangement of the load ports 100 are arbitrary. The transfer robot 110 is a robot for transferring the substrate that is configured to grip or release the substrate between the load port 100, the aligner 120, and the transfer device 700. The transfer robot 110 and the transfer device 700 can perform delivery and receipt of the substrate via a temporary placement table (not illustrated) to grip or release the substrate between the transfer robot 110 and the transfer device 700.

The aligner 120 is a module for adjusting a position of an orientation flat, a notch, and the like of the substrate in a predetermined direction. While the two aligners 120 are disposed to be arranged in the horizontal direction in this embodiment, the number of aligners 120 and arrangement of the aligners 120 are arbitrary. The pre-wet module 200 wets a surface to be plated of the substrate before a plating process with a process liquid, such as pure water or deaerated water, to replace air inside a pattern formed on the surface of the substrate with the process liquid. The pre-wet module 200 is configured to perform a pre-wet process to facilitate supplying the plating solution to the inside of the pattern by replacing the process liquid inside the pattern with a plating solution during plating. While the two pre-wet modules 200 are disposed to be arranged in the vertical direction in this embodiment, the number of pre-wet modules 200 and arrangement of the pre-wet modules 200 are arbitrary.

For example, the pre-soak module 300 is configured to remove an oxidized film having a large electrical resistance present on, a surface of a seed layer formed on the surface to be plated of the substrate before the plating process by etching with a process liquid, such as sulfuric acid and hydrochloric acid, and perform a pre-soak process that cleans or activates a surface of a plating base layer. While the two pre-soak modules 300 are disposed to be arranged in the vertical direction in this embodiment, the number of pre-soak modules 300 and arrangement of the pre-soak modules 300 are arbitrary. The plating module 400 performs the plating process on the substrate. There are two sets of the 12 plating modules 400 arranged by three in the vertical direction and by four in the horizontal direction, and the total 24 plating modules 400 are disposed in this embodiment, but the number of plating modules 400 and arrangement of the plating modules 400 are arbitrary.

The cleaning module 500 is configured to perform a cleaning process on the substrate to remove the plating solution or the like left on the substrate after the plating process. While the two cleaning modules 500 are disposed to be arranged in the vertical direction in this embodiment, the number of cleaning modules 500 and arrangement of the cleaning modules 500 are arbitrary. The spin rinse dryer 600 is a module for rotating the substrate after the cleaning process at high speed and drying the substrate. While the two spin rinse dryers are disposed to be arranged in the vertical direction in this embodiment, the number of spin rinse dryers and arrangement of the spin rinse dryers are arbitrary. The transfer device 700 is a device for transfer the substrate between the plurality of modules inside the plating apparatus 1000. The control module 800 is configured to control the plurality of modules in the plating apparatus 1000 and can be configured of, for example, a general computer including input/output interfaces with an operator or a dedicated computer. The control module 800 may be provided with a non-volatile storage medium to store therein programs, parameters and the like used for controlling the respective parts of the plating apparatus or may be configured to make communication with such a storage medium.

An example of a sequence of the plating processes by the plating apparatus 1000 will be described. First, the substrate housed in the cassette is loaded on the load port 100. Subsequently, the transfer robot 110 grips the substrate from the cassette at the load port 100 and transfers the substrate to the aligners 120. The aligner 120 adjusts the position of the orientation flat, the notch, or the like of the substrate in the predetermined direction. The transfer robot 110 grips or releases the substrate whose direction is adjusted with the aligners 120 to the transfer device 700.

The transfer device 700 transfers the substrate received from the transfer robot 110 to the pre-wet module 200. The pre-wet module 200 performs the pre-wet process on the substrate. The transfer device 700 transfers the substrate on which the pre-wet process has been performed to the pre-soak module 300. The pre-soak module 300 performs the pre-soak process on the substrate. The transfer device 700 transfers the substrate on which the pre-soak process has been performed to the plating module 400. The plating module 400 performs the plating process on the substrate.

The transfer device 700 transfers the substrate on which the plating process has been performed to the cleaning module 500. The cleaning module 500 performs the cleaning process on the substrate. The transfer device 700 transfers the substrate on which the cleaning process has been performed to the spin rinse dryer 600. The spin rinse dryer 600 performs the drying process on the substrate. The transfer device 700 grips or releases the substrate on which the drying process has been performed to the transfer robot 110. The transfer robot 110 transfers the substrate received from the transfer device 700 to the cassette at the load port 100. Finally, the cassette housing the substrate is unloaded from the load port 100.

The configuration of the plating apparatus 1000 illustrated in FIG. 1 and FIG. 2 is only one example, and the configuration of the plating apparatus 1000 is not limited to the configuration of FIG. 1 and FIG. 2.

The following describes the plating module 400. The plurality of plating modules 400 included in the plating apparatus 1000 of the embodiment have similar configurations. Accordingly the description regards one plating module 400.

Figure 3:
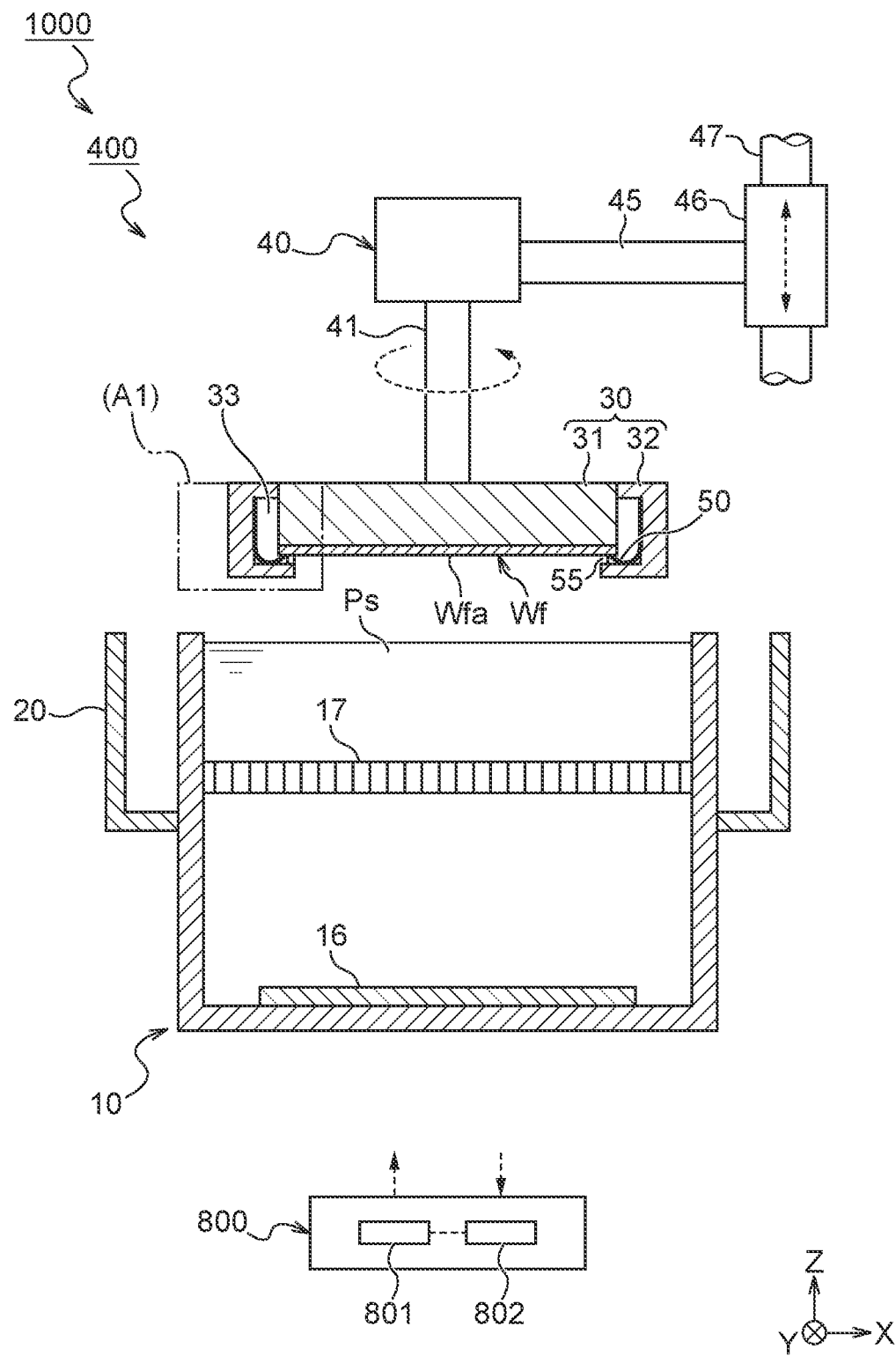
FIG. 3 is a schematic diagram illustrating the configuration of a plating module in the plating apparatus according to the embodiment.

FIG. 3 is a schematic diagram illustrating the configuration of the plating module 400 in the plating apparatus 1000 according to the embodiment. The plating apparatus 1000 of the embodiment is a face-down-type or cup-type plating apparatus. The plating module 400 in the plating apparatus 1000 of the embodiment mainly includes a plating tank 10, an overflow tank 20, a substrate holder 30 that is also referred to as a plating head, a rotating mechanism 40, a tilting mechanism 45, and a lifting mechanism 46. The tilting mechanism 45 may, however, be omitted.

The plating tank 10 according to the embodiment is configured by a bottomed vessel having an opening on an upper side thereof. The plating tank 10 has a bottom wall and an outer peripheral wall extended upward from an outer circumferential edge of this bottom wall and is open on an upper side of this outer peripheral wall. A plating solution Ps is stored inside of the plating tank 10. According to the embodiment, the plating tank 10 has a cylindrical shape.

The plating solution Ps is not specifically limited but may be any solution containing an ion of a metal element that forms a plating film. According to the embodiment, a copper plating process is employed as one example of the plating process, and a copper sulfate solution is used as one example of the plating solution Ps. According to the embodiment, the plating solution Ps includes predetermined additive(s). This preparation is, however, not essential, and the plating solution Ps may be prepared without any additives.

An anode 16 is placed inside of the plating tank 10. The type of the anode 16 usable is not specifically limited but may be a soluble anode or an insoluble anode. According to the embodiment, an insoluble anode is used as the anode 16. The type of this insoluble anode usable is not specifically limited but may be, for example, platinum or iridium oxide.

The overflow tank 20 is configured by a bottomed vessel placed outside of the plating tank 10. The overflow tank 20 serves to temporarily accumulate the plating solution Ps flowing over an upper edge of the plating tank 10. In one exemplified configuration, the plating solution Ps in the overflow tank 20 is discharged from a discharge port (not shown) for the overflow tank 20, is temporarily collected in a reservoir tank (not shown) and is then returned to the plating tank 10 again.

A porous resistor body 17 is placed above the anode 16 inside of the plating tank 10. More specifically, the resistor body 17 is configured by a porous plate member having a plurality of apertures (pores). The plating solution Ps that is present on a lower side of the resistor body 17 is allowed to pass through the resistor body 17 and to flow up to an upper side of the resistor body 17. This resistor body 17 is a member provided to uniformize an electric field formed between the anode 16 and a substrate Wf Placing this resistor body 17 in the plating tank 10 facilitates uniformization of the film thickness of the plating film (plating layer) formed on the substrate Wf. The resistor body 17 is, however, not an essential component according to the embodiment. The embodiment may be configured without the resistor body 17.

As shown in FIG. 3, the substrate holder 30 is a member configured to hold the substrate Wf serving as a cathode. More specifically, the substrate holder 30 is placed above the anode 16 (and is also above the resistor body 17 according to the embodiment). The substrate holder 30 holds the substrate Wf such that a lower face Wfa of the substrate Wf is opposed to the anode 16 and the resistor body 17. The lower face Wfa of the substrate Wf corresponds to a surface to be plated or a plating surface.

The substrate holder 30 of the embodiment includes a first holding member 31, a second holding member 32, contacts 50 and a sealing member 55. The substrate holder 30 holds the substrate Wf in such a manner that the substrate Wf is placed between the first holding member 31 and the second holding member 32. The first holding member 31 holds an upper face Wfb of the substrate Wf. The second holding member 32 holds an outer peripheral portion of the lower face Wfa of the substrate Wf More specifically, the second holding member 32 of the embodiment holds the outer peripheral portion of the lower face Wfa of the substrate Wf via the sealing member 55. When the substrate holder 30 holds the substrate Wf, the sealing member 55 comes into close contact with the substrate Wf to form a sealed space 33 that protects the contacts 50 and a contact area of the substrate Wf (an area of the outer peripheral portion of the substrate that is in contact with the contacts 50) from the plating solution.

As shown in FIG. 3, the substrate holder 30 is connected with a rotating shaft 41 of the rotating mechanism 40. The rotating mechanism 40 is a mechanism configured to rotate the substrate holder 30. A known mechanism such as a motor may be used as the rotating mechanism 40. The tilting mechanism 45 is a mechanism configured to incline the rotating mechanism 40 and the substrate holder 30. A known tilting mechanism such as a piston and cylinder may be used as the tilting mechanism 45. The lifting mechanism 46 is supported by a support shaft 47 that is extended in a vertical direction. The lifting mechanism 46 is a mechanism configured to move up and down the substrate holder 30, the rotating mechanism 40 and the tilting mechanism 45 in the vertical direction. A known lifting mechanism such as a direct-acting actuator or a liner actuator may be used as the lifting mechanism 46.

In the plating process, while the rotating mechanism 40 rotates the substrate holder 30, the lifting mechanism 46 moves down the substrate holder 30, so as to soak the substrate Wf into the plating solution Ps in the plating tank 10. In this process of soaking the substrate Wf into the plating solution Ps, the tilting mechanism 45 may incline the substrate holder 30 as needed basis. A conducting device/power supply (not shown) is subsequently used to supply electric current through the plating solution Ps to between the anode 16 and the substrate Wf. This forms a plating film on the lower face Wfa of the substrate Wf.

The operations of the plating module 400 are controlled by the control module 800. The control module 800 has a microcomputer. This microcomputer includes a CPU (central processing unit) 801 serving as a processor and a storage portion 802 serving as a non-transitory storage medium. In the control module 800, the CPU 801 is operated in response to commands of programs stored in the storage portion 802, so as to control the portions to be controlled or the control portions of the plating module 400. The programs include, for example, programs of performing transport control of a transfer robot and a transfer device, control of processings in respective processing modules, control of the plating process in the plating module, and control of a cleaning process, as well as a program of detecting any abnormalities of various devices. The storage medium may include nonvolatile and/or volatile storage media. Examples of the storage medium usable are any known storage media including computer readable memories such as a ROM, a RAM and a flash memory and disk-type storage media such as a hard disk, a CD-ROM, a DVD-ROM, and a flexible disk. The control module 800 is configured to make communication with a non-illustrated upper-level computer that performs integrated control of the plating apparatus and other relevant devices and apparatuses and to send and receive data to and from a database included in the upper-level controller. Part or the entirety of the functions of the control module 800 may be configured by a hardware configuration such as an ASIC. Part or the entirety of the functions of the control module 800 may also be configured by a PLC, a sequencer or the like. Part or the entirety of the control module 800 may be placed inside and/or outside of the housing of the plating apparatus. Part or the entirety of the control module 800 is connected with to make communication with respective parts of the plating apparatus by wire and/or wirelessly.

Figure 4:
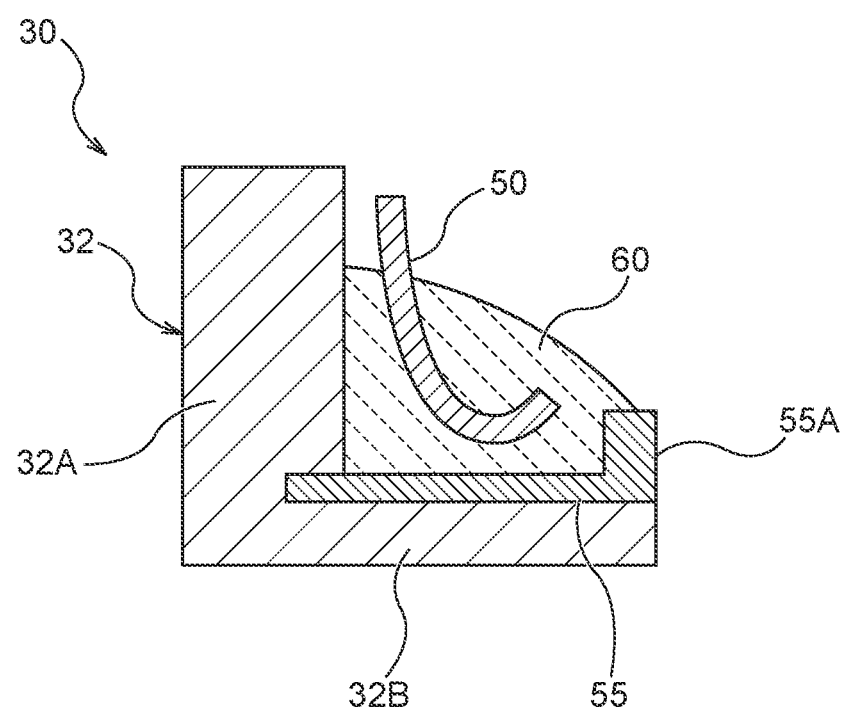
FIG. 4 is a sectional view schematically illustrating closeup of part of a substrate holder according to the embodiment.

FIG. 4 is a sectional view schematically illustrating closeup of part of the substrate holder 30 (part A1 shown in FIG. 3). With referring to FIG. 3 and FIG. 4, the contacts 50 are placed in the substrate holder 30 of the embodiment to be in contact with the contact area in the outer peripheral portion of the lower face Wfa of the substrate Wf and supply electricity to the substrate Wf More specifically, the contacts 50 of the embodiment are placed in the second holding member 32 of the substrate holder 30. According to the embodiment, a plurality of the contacts 50 are placed in a circumferential direction of the substrate holder 30 (more specifically, in a circumferential direction of the second holding member 32). Each of the contacts 50 has a plurality of (for example, four) plate-like electrodes called fingers. The plurality of contacts 50 are arranged equally in the circumferential direction of the substrate holder 30. The number of the plurality of contacts 50 is not specifically limited but is twelve as an example according to the embodiment. The plurality of contacts 50 are electrically connected with the conducting device (not shown) and serve to supply the electricity supplied from the conducting device to the substrate Wf (more specifically, to a seed layer Sd formed on the lower face Wfa of the substrate Wf).

As shown in FIG. 3 and FIG. 4, the plating module 400 of the embodiment is provided with the sealing member 55 configured to suppress the contacts 50 from being exposed to and coming into contact with the plating solution Ps in the plating tank 10. The sealing member 55 has a lip portion 55A that is provided to be protruded toward the substrate and that comes into contact with the lower face Wfa of the substrate Wf More specifically, the lip portion 55A of the sealing member 55 according to the embodiment is placed on an inner side of the contacts 50 (on an inner side in a radial direction of the substrate holder 30) and is placed between the second holding member 32 of the substrate holder 30 and the lower face Wfa of the substrate Wf when the substrate Wf is held by the substrate holder 30. In this illustrated example, the lip portion 55A is provided in the vicinity of an inner edge in the radial direction of the sealing member 55. The sealing member 55 has, for example, a ring shape along the outer peripheral portion of the substrate Wf. The plating module 400 provided with this sealing member 55 effectively suppresses the contacts 50 from being exposed to and coming into contact with the plating solution Ps when the substrate Wf is soaked in the plating solution Ps.

As shown in FIG. 4, the second holding member 32 of the substrate holder 30 includes an outer peripheral wall 32A and a substrate receiver 32B that is protruded inward in the radial direction in the vicinity of a lower edge of the outer peripheral wall 32A. The sealing member 55 is provided in or on the substrate receiver 32B. The second holding member 32 is a member configured to hold the sealing member 55 and is thus also called a seal ring holder (SRH). The second holding member 32 may be configured by assembling a plurality of members. For example, the outer peripheral wall 32A and the substrate receiver 32B may be provided separately and integrated with each other. The lip portion 55A is brought into contact with the substrate Wf to form the sealed space 33 in the substrate holder 30 as shown in FIG. 3, so as to shield/protect contact locations between the contacts 50 and the substrate Wf (the seed layer Sd of the contact area described later) from the plating solution Ps.

According to the embodiment, as shown in FIG. 4, the substrate Wf is subjected to the plating process in such a state that contact portions (leading end portions in this illustrated example) of the contacts 50 that come into contact with the substrate Wf are covered with a liquid 60 having an electric conductivity controlled to be lower than a predetermined reference value described later. The liquid 60 may be pure water, deaerated water or another liquid (liquid used for a process, for example, a pre-wet process, a pre-soak process, or a cleaning process). More specifically, a cleaning nozzle 71 (shown in FIG. 7) is provided to clean the contacts 50 with pure water after the plating process without detaching the contacts 50 from the apparatus, and a liquid receiving tray 72 is also provided to receive the waste cleaning liquid. A conductance meter 74 configured to measure the electric conductivity (conductance) of the waste cleaning liquid is placed in the liquid receiving tray 72 and/or in a liquid discharge pipe 73 which the waste cleaning liquid is discharged through, so as to measure the cleaning degree of the contacts 50 from the electric conductivity of the waste cleaning liquid. The supply of a cleaning liquid from the cleaning nozzle 71 is stopped when the electric conductivity becomes lower than a predetermined reference value determined by an experiment or the like. In the plating process, electric current is flowed to between the contacts 50 and the substrate Wf in such a state that the contact locations between the contacts 50 and the substrate Wf are covered with the liquid 60 having the controlled electric conductivity. According to the embodiment, the substrate receiver 32B is configured to reserve the liquid 60 that is used to cover the contact locations of the contacts 50 in contact with the substrate Wf. Furthermore, according to the embodiment, the sealing member 55 (the lip portion 55A in the illustrated example of FIG. 4) serves to suppress or prevent the liquid 60 from dripping off to an inner side in the radial direction. Additionally, the outer peripheral wall 32A on an outer circumferential side of the substrate receiver 32B serves to restrict the move of the liquid 60. It may thus be regarded that the substrate receiver 32B of the substrate holder 30, the sealing member 55 and the outer peripheral wall 32A constitute a container for accumulating the liquid 60 therein (the liquid 60 is, however, not necessarily in contact with the outer peripheral wall 23A).

In the configuration of the embodiment, an experiment described later supplies 13 ml or more of pure water through the cleaning nozzle 71 and rotates the substrate holder 30 by at least one full revolution during the supply of pure water, so as to cause pure water to be supplied uniformly to the contacts 50. The volume of the liquid of 13 mL is a value obtained by summing up the volumes of pure water required for fully wetting the contact locations of the respective fingers of the contacts 50 in contact with the substrate Wf (the seed layer Sd) with regard to twelve contacts 50 (corresponding to the whole circumference of the substrate Wf). In other words, the volume of the liquid of 13 mL is the volume of pure water required for fully wetting the contact locations of all the contacts 50 of the substrate holder 30 in contact with the substrate Wf.

In the configuration of the embodiment, the experiment described later has showed that the reference value of the electric conductivity to be not higher than 50 µS/cm does not damage the seed layer Sd of the substrate Wf. Accordingly, after cleaning of the contacts 50, the cleaning liquid (for example, pure water) that is left on the contacts 50 and that has the electric conductivity controlled to be not higher than the predetermined reference value is not drained but is used as covering liquid (covering water) for covering the contact locations between the contacts and the substrate in the course of processing the substrate. This saves the effort of drying the contacts and prevents the plating process to be performed in the state that the contacts 50 and the substrate Wf are half wet.

The contact area of the substrate Wf (the area that is in contact with the contacts 50) wetted in a pre-process such as a pre-wet process is not dried until completion of plating. This reduces or prevents the following problems or troubles. When the contact area of the substrate wetted in the pre-process is dried, water may be drained even from inside of peripheral openings of a pattern. This is likely to cause air bubbles to remain inside of the openings of the pattern in the course of plating and to cause such a problem that the locations of the remaining air bubbles are not plated. Furthermore, the surface of the seed layer in the contact area of the half-dried substrate is likely to be oxidized and to cause a conduction failure. Moreover, when the contact location between the seed layer of the substrate and the contact is half wet, the seed layer Sd is likely to be dissolved by the local cell action due to dissolved oxygen and/or the shunt current (split flow of electric current flowing between the contact 50 and the seed layer Sd via the liquid at a location other than the contact location between the contact 50 and the seed layer Sd of the substrate Wf). This is likely to cause a variation in supply of electricity and to lower the in-plane uniformity of the thickness of the plating film.

Figure 12:
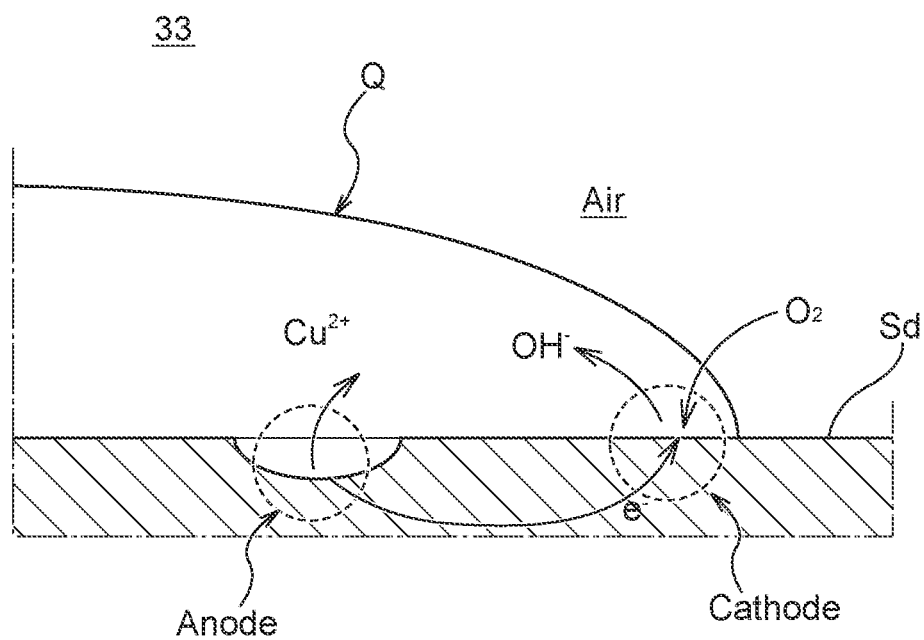
FIG. 12 is an explanatory view illustrating dissolution of a seed layer caused by the local cell effect.

FIG. 12 is an explanatory view illustrating dissolution of a seed layer caused by the local cell effect due to dissolved oxygen. It is assumed that a liquid Q adheres to the seed layer Sd in the vicinity of a contact location with the contact 50 in the sealed space 33 (shown in FIG. 3) filled with the air. In this state, as shown in this drawing, oxygen $O_2$ in the air is dissolved in the liquid Q. A local cell action then proceeds to cause $O_2$ to receive an electron transferred from Cu in the seed layer Sd and to be changed to $OH^-$, while causing Cu to be changed to $Cu^{2+}$ and dissolved into the liquid Q. This results in dissolving the seed layer Sd. This reaction causes Cu to be dissolved from the seed layer Sd and thins down the seed layer Sd. This is likely to increase the electric resistance of the seed layer Sd and cause a variation in supply of electricity. This phenomenon is attributed to the location of a gas-liquid interface close to the seed layer Sd.

Figure 13:
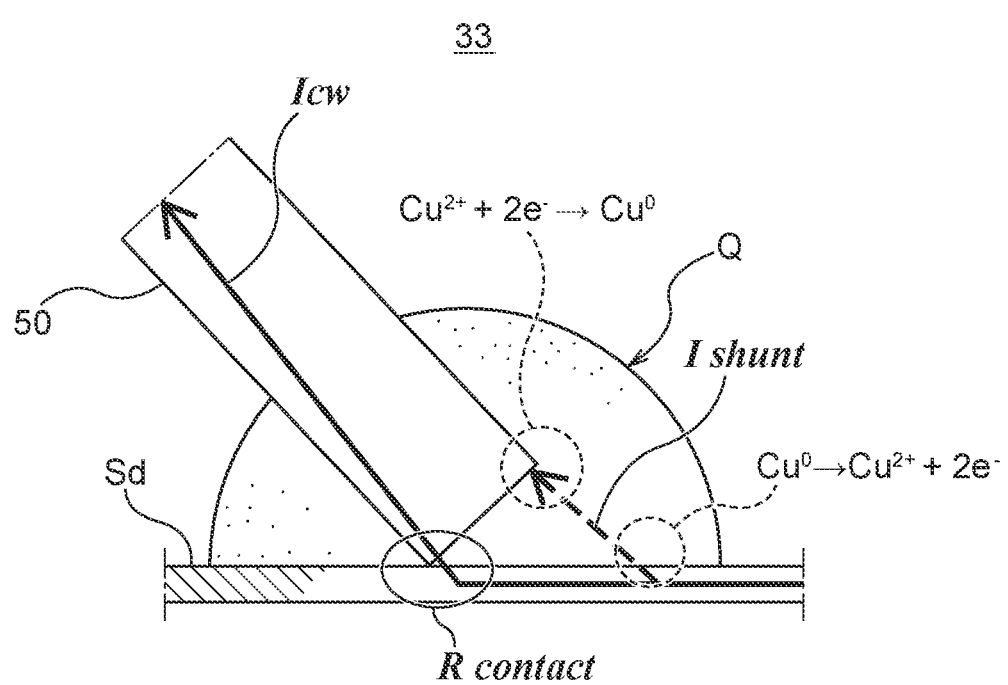
FIG. 13 is an explanatory view illustrating dissolution of a seed layer caused by the shunt current.

FIG. 13 is an explanatory view illustrating dissolution of a seed layer caused by the shunt current. In the case where the contact location of the contact 50 with the seed layer Sd is covered with a liquid Q having a high electric conductivity (for example, a plating solution or a liquid containing a plating solution) in the sealed space 33, under the condition of a high electric resistance of the seed layer Sd and/or a high contact resistance between the contact 50 and the seed layer Sd, shunt current Ishunt (split flow of an electric current Icw flowing through the contact location) flows from the seed layer Sd through the liquid Q to the contact 50 by the ion conduction in the liquid Q and the redox reaction on the surface of the seed layer Sd and on the surface of the contact. The shunt current Ishunt is flowed when Cu is changed to $Cu^{2+}$ on the surface of the seed layer Sd to be dissolved in the liquid Q and $Cu^{2+}$ in the liquid Q is changed to Cu on the surface of the contact 50. Accordingly, when the shunt current is generated, Cu in the seed layer Sd is likely to be dissolved to thin down the seed layer Sd, to increase the electric resistance of the seed layer Sd and to cause a variation in supply of electricity. This shunt current is attributed to the high electric conductivity of the liquid that covers the contact location between the contact 50 and the seed layer Sd.

Figure 5:
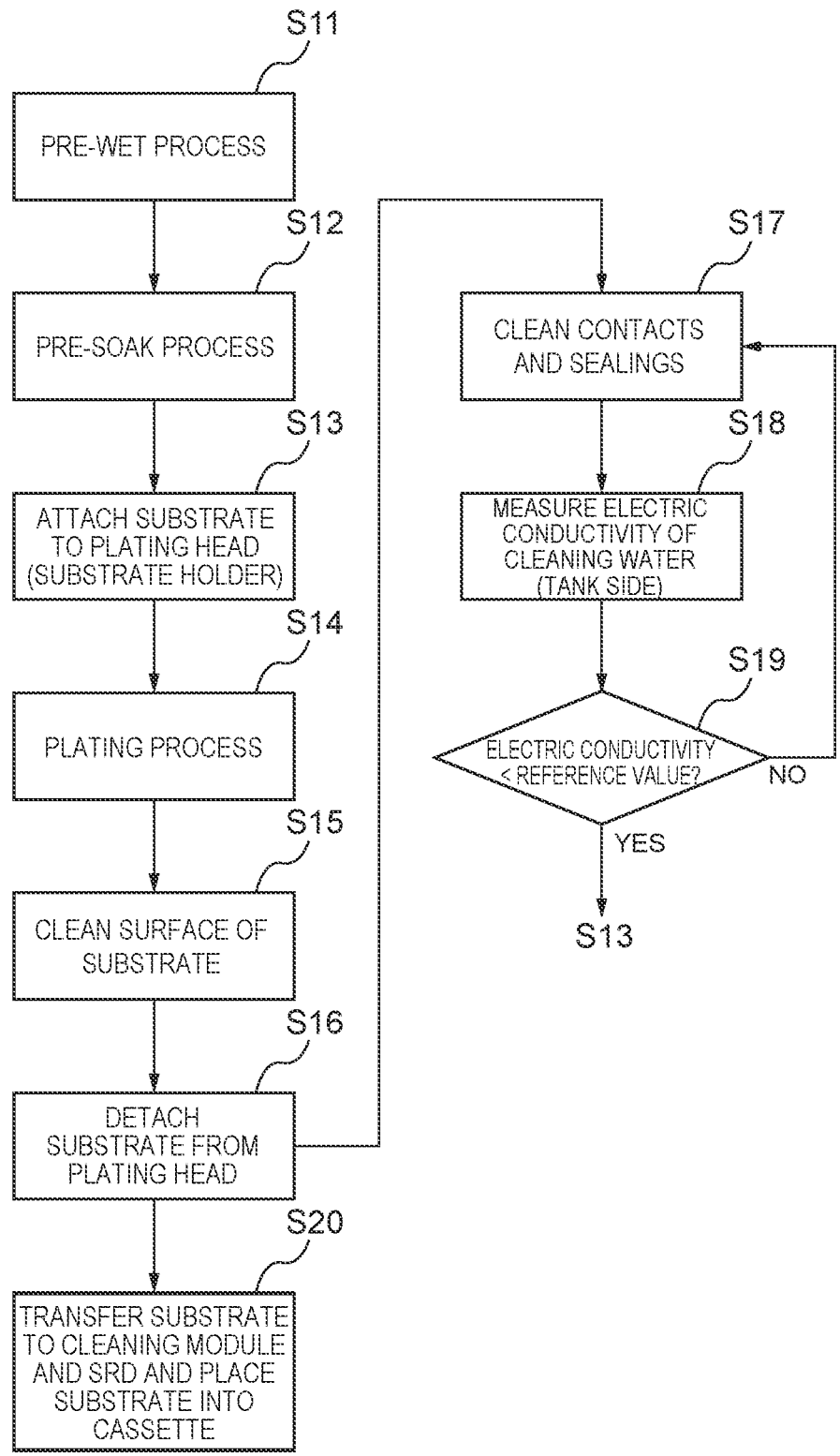
FIG. 5 is a flowchart showing a flow of a control method of the plating apparatus.
Figure 6:
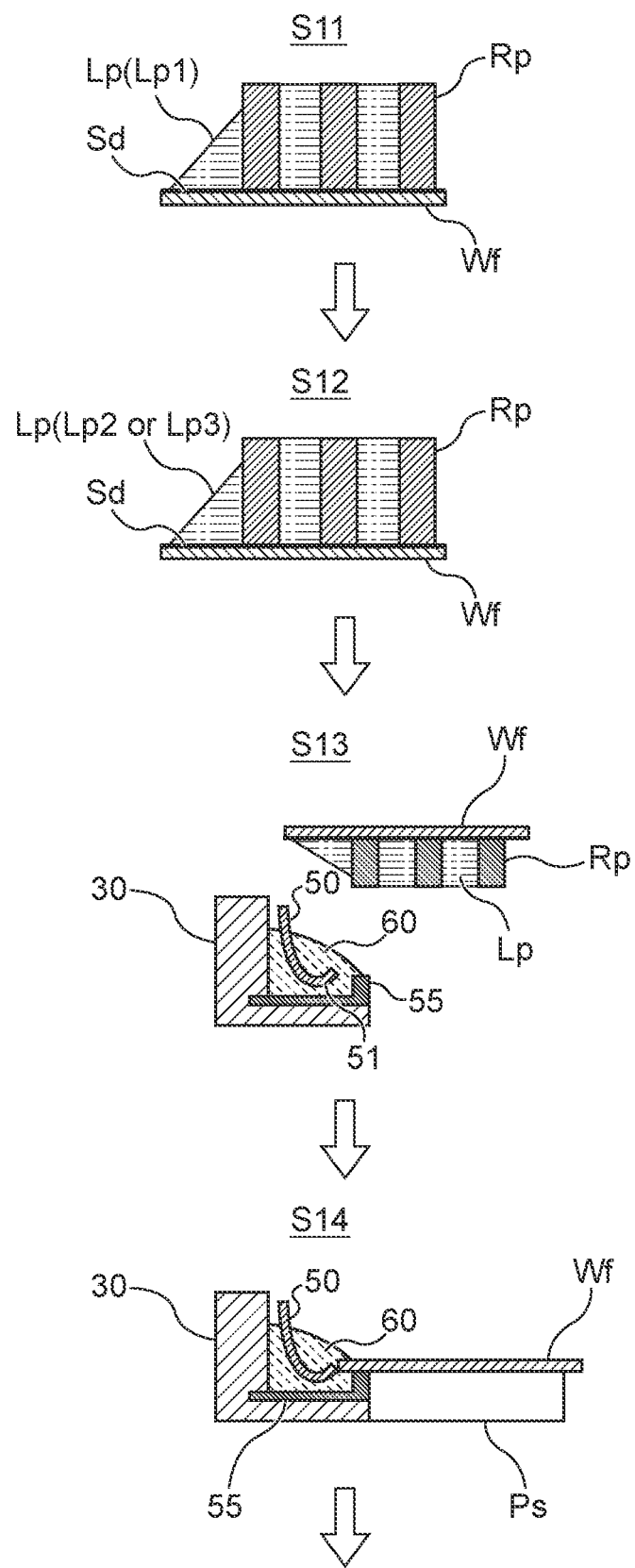
FIG. 6 is an explanatory view illustrating the flow of the control method of the plating apparatus.
Figure 7:
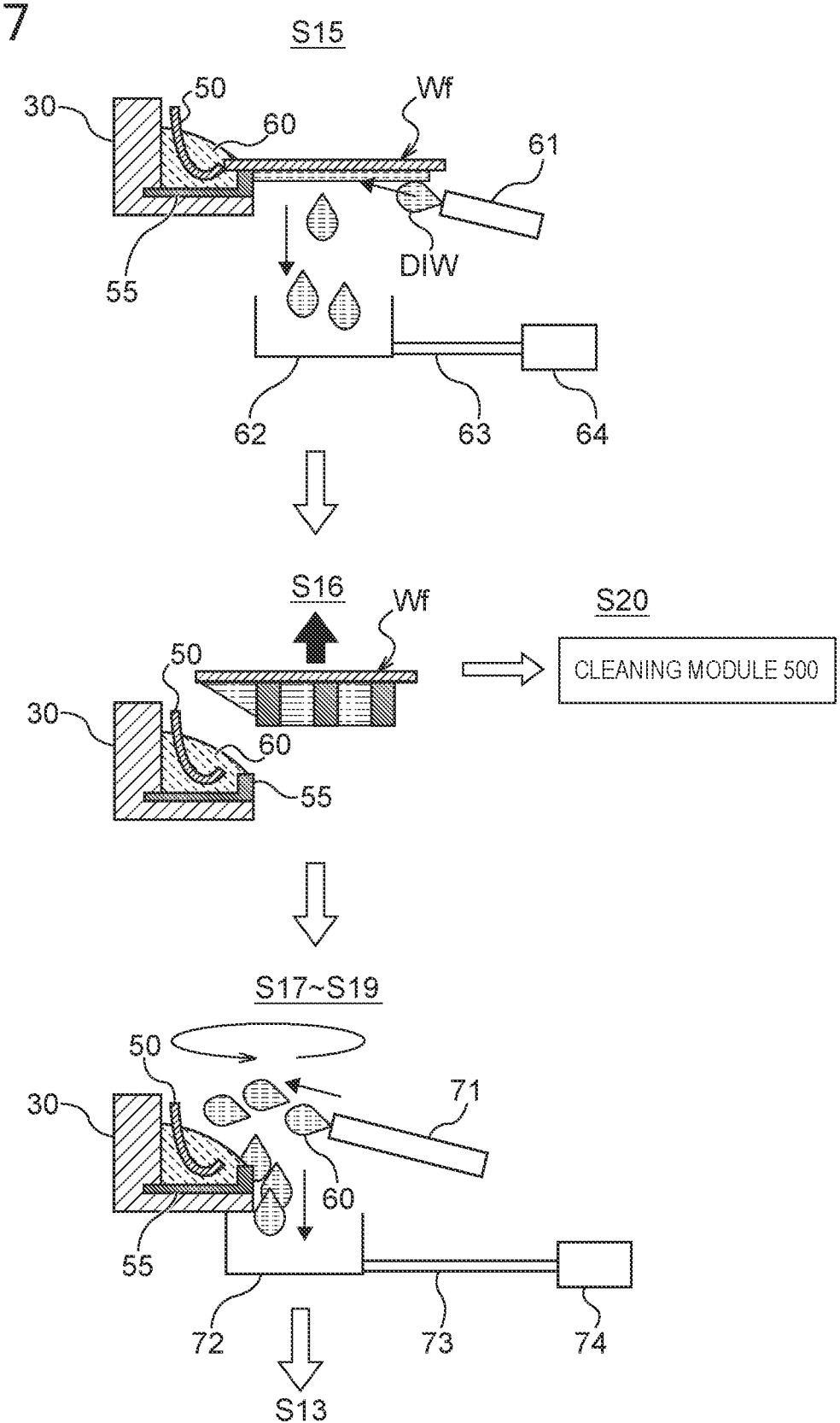
FIG. 7 is an explanatory view illustrating the flow of the control method of the plating apparatus.

FIG. 5 is a flowchart showing a flow of a control method of the plating apparatus. FIG. 6 and FIG. 7 are explanatory views illustrating the flow of the control method of the plating apparatus. The following describes the control method of the plating apparatus according to the embodiment with reference to these drawings.

At step S11, the substrate Wf with the seed layer Sd provided on a surface to be plated or a plating surface is processed by a pre-wet process in the pre-wet module 200. The pre-wet process wets the plating surface of the substrate prior to a plating process with a process liquid Lp1, such as pure water or deaerated water, and thereby displaces the air inside of a resist pattern Rp formed on the surface of the substrate with the process liquid Lp1. The substrate Wf after the pre-wet process is wet with the process liquid Lp1, and inside of openings of the resist pattern Rp on the surface of the substrate Wf is filled with the process liquid Lp1 (as shown in FIG. 6).

At step S12, the substrate Wf is processed by a pre-soak process in the pre-soak module 300. The pre-soak process may be omitted in some cases. The pre-soak process removes, for example, an oxide film that is present, for example, on the surface of the seed layer Sd formed on the plating surface of the substrate Wf prior to the plating process and that has a high electric resistance, by etching with a process liquid Lp2, such as sulfuric acid or hydrochloric acid, so as to clean or activate the surface of a plating base layer. After the pre-soak process, the substrate Wf may be cleaned with a process liquid Lp3, such as pure water or deaerated water. The substrate Wf after the pre-wet process is wet with the process liquid Lp2 (or Lp3), and inside of the openings of the resist pattern Rp on the surface of the substrate Wf is filled with the process liquid Lp2 (or Lp3) (as shown in FIG. 6). In the following description, the process liquids Lp1, Lp2 and Lp3 may collectively be referred to as process liquid Lp.

At step S13, the substrate Wf transferred to the plating module 400 is attached to the substrate holder 30 that is also called a plating head. In this state, as shown in FIG. 6, the substrate Wf is wet with the process liquid Lp (Lp1, Lp2 or Lp3). A contact portion 51 of the contact 50 of the substrate holder 30 is covered with the liquid 60 supplied as a covering liquid in a cleaning process at step S15 and/or at step S17 described later. The contact portion 51 of the contact 50 denotes a portion of the contact 50 that comes into contact with the seed layer Sd of the substrate Wf (in this illustrated example, a leading end portion of the contact 50).

At step S14, the substrate Wf held by the substrate holder 30 is soaked in the plating solution Ps in the plating tank 10 to be processed by the plating process. The resist pattern Rp of the substrate Wf is omitted from the illustration of step S14 in FIG. 6. In this state, the contact location between the contact 50 of the substrate holder 30 and the substrate Wf is covered with a sufficient volume of the liquid 60 that has the electric conductivity controlled to a low electric conductivity. This suppresses or prevents the seed layer Sd from being dissolved by the local cell effect and/or the shunt current. This also suppresses or prevents the surface of the seed layer Sd in the contact area of the half-dried substrate Wf from being oxidized.

At step S15, after the plating process, the substrate holder 30 is lifted up to above the liquid surface of the plating solution Ps in the plating tank 10, and the plating surface of the substrate Wf is cleaned with a cleaning liquid supplied through a cleaning liquid nozzle 61 (as shown in FIG. 7). In this state, the substrate holder 30 and/or the cleaning liquid nozzle 61 may be rotated to evenly clean the substrate Wf with the cleaning liquid. This cleaning process enables the plating solution adhering to the substrate Wf to be collected and appropriately reused, and/or wets the plating surface of the substrate Wf and thereby prevents the plating surface from being dried. The cleaning liquid is, for example, pure water, deaerated water or another liquid (liquid used for a process, for example, the pre-wet process, the pre-soak process, or the cleaning process). The cleaning liquid used for cleaning is collected in a liquid receiving tray 62 placed below the substrate Wf and is discharged through a liquid discharge pipe 63. A conductance meter 64 may be provided in the liquid receiving tray 62 and/or in the liquid discharge pipe 63, so as to measure the electric conductivity of the collected cleaning liquid (pure water). The collected cleaning liquid after adjustment of the concentration or without adjustment of the concentration may be returned to the plating tank 10 to be reused. The cleaning liquid nozzle 61 and the liquid receiving tray 62 may be configured to be moved to below the substrate holder 30 when the substrate holder 30 is lifted up and to be moved back from below the substrate holder 30 after the cleaning process.

At step S16, the substrate Wf is detached from the substrate holder 30. The detached substrate Wf is sequentially transferred to the cleaning module 500 and the spin rinse dryer 600 to be subjected to a cleaning process and a drying process and is then transferred to the cassette of the load port 100 (step S20).

At step S17, the contacts 50 and the sealing member 55 of the substrate holder 30 after the detachment of the substrate Wf are cleaned with a predetermined volume of the cleaning liquid 60 supplied through the cleaning nozzle 71. In this state, the substrate holder 30 is rotated by at least one full revolution, so that pure water is evenly supplied to the contacts 50. The cleaning nozzle 71 may be rotated or both the substrate holder 30 and the cleaning nozzle 71 may be rotated, with a view to supplying pure water to all the contacts 50 on at least one occasion. The configuration of the embodiment wets both the substrate Wf-side and the substrate holder 30-side, so as to ensure that the contact locations between the contacts 50 and the seed layer Sd of the substrate are covered with a sufficient volume of water. The cleaning liquid 60 may be, for example, pure water, deaerated water or another liquid (liquid used for a process, for example, the pre-wet process, the pre-soak process, or the cleaning process). The cleaning liquid 60 used for cleaning is collected in the liquid receiving tray 72 placed below the substrate Wf and is discharged through the liquid discharge pipe 73. The conductance meter 74 is provided in the liquid receiving tray 72 and/or in the liquid discharge pipe 73. The electric conductivity of the collected cleaning liquid (pure water) is measured by the conductance meter 74 (step S18). The electric conductivity measured by the conductance meter 74 is given to the control module 800. At step S19, it is determined whether or not the measured electric conductivity of the cleaning liquid is lower than the reference value. When the electric conductivity of the cleaning liquid is not lower than the reference value, the processing flow returns to step S17 to continue the cleaning process. When the electric conductivity of the cleaning liquid is lower than the reference value, on the other hand, the processing flow returns to step S13 to wait for a next substrate Wf transferred into the plating module 400 and to attach the next substrate Wf to the substrate holder 30.

The above series of processing is repeatedly performed to sequentially process and plate a plurality of the substrates Wf. In the case where a first substrate Wf is subjected to a plating process or in the case where a certain time period has elapsed since removal of the substrate Wf after the plating process from the plating module 400, the contact portions 51 of the contacts 50 of the substrate holder 30 are likely to be dried or to be half dried. Furthermore, when a certain time period has elapsed since completion of cleaning, carbon dioxide in the atmosphere is gradually dissolved into the cleaning liquid on the substrate holder. This is likely to increase the electric conductivity of the cleaning liquid to become higher than the reference value. In such a case, prior to the plating process of the substrate Wf, the processing of steps S17 to S19 is performed to cover the contact portions 51 of the contacts 50 of the substrate holder 30 with the liquid 60, and the wet substrate Wf is then attached to the substrate holder 30 at step S13.

Figures 8, 9, 10:
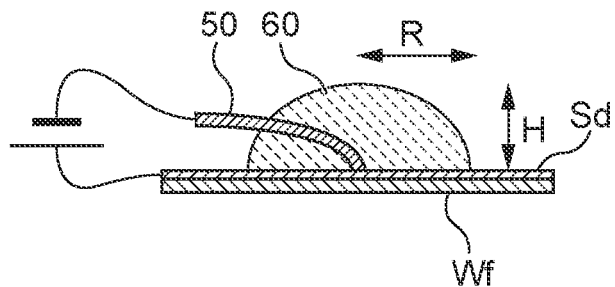
FIG. 8 is a diagram illustrating an example of measurement showing a relationship of the volume of a cleaning liquid used for cleaning a contact to a change in the appearance of a seed layer.
FIG. 9 is an explanatory view illustrating the height and the diameter of the cleaning liquid to cover the contact.
FIG. 10 is a diagram illustrating an example of measurement showing a relationship of the electric conductivity of the cleaning liquid that covers a contact to a change in the appearance of the seed layer.

The following describes a method of determining the reference value of the electric conductivity used at step S19. In order to prevent corrosion of the surface of the seed layer Sd of the substrate Wf, it is required to keep the contact location between the substrate Wf and the contact 50 distant away from the gas-liquid interface. The required distance and the required volume of the liquid were calculated from the results of measurement by an experiment. FIG. 8 is a diagram illustrating an example of measurement showing a relationship of the volume of a cleaning liquid used for cleaning a contact to a change in the appearance of a seed layer. FIG. 9 is an explanatory view illustrating the height and the diameter of the cleaning liquid to cover the contact. This experiment used pure water having the electric conductivity of 1 µS/cm as the cleaning liquid.

In the table of FIG. 8, the upper-most row shows the volume of pure water dropping down to four fingers of a contact. The second row shows a height H of a liquid droplet covering the contact. The third row shows the volume of pure water converted into a value for one substrate Wf. The fourth row shows a change in the appearance of the seed layer Sd.

As shown in FIG. 9, a contact 50 was brought into contact with a substrate Wf with a copper seed layer Sd equivalent to the substrate Wf to be plated, and each volume of a liquid droplet (the liquid 60 (pure water) having the electric conductivity of 1 µS/cm) shown in FIG. 8 was dropped down to four fingers of the contact (fingers included in one contact). The contact 50 and the substrate Wf were then connected with each other by a power source. An equivalent amount of electric current to the electric current used for plating (converted into a value for the four fingers) was applied from the power source for a plating time, and corrosion in the appearance of the seed layer Sd was checked.

A large number of the contacts 50 are placed along the outer circumference of the substrate in the plating apparatus 1000. The volume of the liquid 60 was converted into a value for one substrate (wafer) as shown in the third row of FIG. 8. The shortest distance H from the contact location between the contact 50 and the substrate Wf to a gas-liquid interface (an interface between the liquid 60 and the air) was calculated by measuring a length in the cross section of the liquid droplet of the liquid 60 shown in FIG. 9. In general, a liquid droplet spreads and wets in a horizontal direction and is crushed in a vertical direction by the gravity. Accordingly, the liquid droplet has a length H in the vertical direction<a length R in the horizontal direction (diameter of the liquid droplet). Furthermore, an increase in the volume of the liquid causes a liquid droplet to be crushed to a larger degree, so that the volume of the liquid is not linearly related to the height H.

According to the results of the measurement shown in FIG. 8, the required distance H from the contact location between the contact 50 and the seed layer Sd to the gas-liquid interface that does not cause corrosion of the seed layer Sd of the substrate Wf was at least 1.2 mm. With respect to the volume of the liquid, the plating process performed after uniformly applying an equivalent volume of 13 mL of pure water per one wafer onto the contacts did not cause a damage of the seed layer Sd. According to the configuration of the substrate holder 30 of the embodiment, the maximum carriable volume of the liquid (the maximum volume of pure water that is not dripped off from the lip portion 55A of the sealing member 55) was 26 mL.

The experiment subsequently performed the plating process for the substrate Wf held by the substrate holder 30 and determined the reference value of the electric conductivity of the liquid 60 covering the contact 50. More specifically, the experiment cleaned the contact 50 of the substrate holder 30, applied pure water premixed with the plating solution to adjust the electric conductivity, on the contact 50 by an equivalent volume of 13 mL for the entire substrate Wf, and placed the substrate Wf to be subjected to the plating process. The experiment then observed the appearance of the seed layer Sd in the vicinity of the contact location between the substrate Wf and the contact 50. The experiment also measured a distribution of the film thickness on the outer peripheral portion of the substrate (r>140 mm), calculated the in-plane uniformity U % of the thickness of the plating film, and checked for a variation in supply of electricity among the contacts 50.

Figure 11:
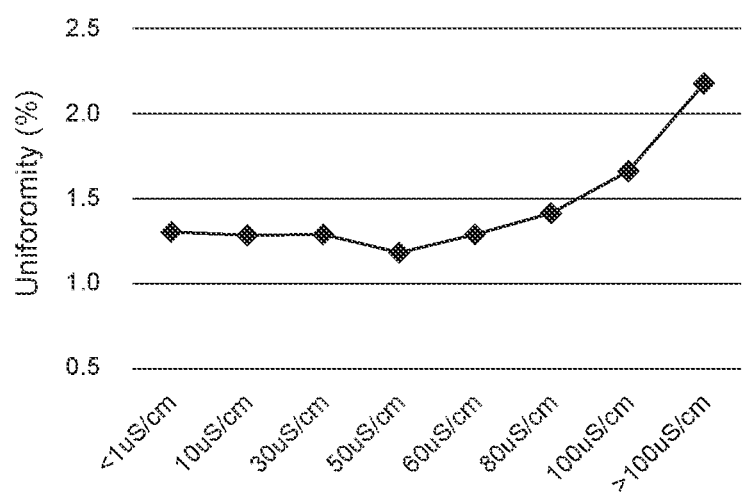
FIG. 11 is a diagram illustrating an example of measurement showing a relationship of the electric conductivity of the cleaning liquid that covers the contact to the in-plane uniformity.

FIG. 10 is a diagram illustrating an example of measurement showing a relationship of the electric conductivity of the cleaning liquid (pure water) that covers a contact to a change in the appearance of the seed layer. FIG. 11 is a diagram illustrating an example of measurement showing a relationship of the electric conductivity of the cleaning liquid (pure water) that covers the contact to the in-plane uniformity. In FIG. 10, the first row shows the electric conductivity of pure water, the second row shows the appearance of the seed layer, and the third row shows the in-plane uniformity of the thickness of the plating film on the outer peripheral portion of the substrate (r>140 mm). In FIG. 11, the abscissa shows the electric conductivity of pure water, and the ordinate shows the in-plane uniformity of the thickness of the plating film on the outer peripheral portion of the substrate (r>140 mm).

As shown in FIG. 10 and FIG. 11, according to the results of this experiment, controlling the electric conductivity of the liquid 60 to be not higher than 50 µS/cm enabled the substrate Wf to be plated without damaging the seed layer Sd. The electric conductivity of not lower than 80 µS/cm, on the other hand, caused corrosion of the seed layer Sd, led to poor electric conduction between the contact 50 and the seed layer Sd, and reduced the in-plane uniformity of the thickness of the plating film. These results show that the reference value of the electric conductivity of the liquid 60 covering the contact 50 should be set to 50 µS/cm. These results of the measurement are those with regard to the configuration of the plating apparatus according to the embodiment (including the preparation of the plating solution). The appropriate volume of the cleaning liquid (a reference value of the volume of the liquid), the shortest distance H and the reference value of the electric conductivity should be determined according to the configuration of the plating apparatus. In the configuration used according to the embodiment, the cleaning process of steps S17 to S19 using the cleaning liquid (pure water) controlled to have the electric conductivity of lower than 50 µS/cm has proved that the electric conductivity of pure water covering the contacts 50 is lower than 50 µS/cm, that the volume of pure water covering the contacts 50 is not less than 13 mL, and that the distance H from the contact location between the contact 50 and the seed layer Sd to the gas-liquid interface is not shorter than 1.2 mm.

The configuration of the embodiment described above has at least functions and advantageous effects described below.

(1) In the case where a substrate processed in a separate unit by a pre-process such as a pre-wet process is transferred to a plating tank, an area on an outer peripheral portion of the substrate that comes into contact with contacts (contact area) is wet. The plating process performed after drying of the contact area is likely to dry even a pattern on the outer peripheral portion of the substrate and to cause a plating failure. More specifically, drying the contact area of the substrate is likely to cause water to be drained even from a peripheral resist pattern and to cause air bubbles to remain in the resist pattern in the course of plating, so as to cause such a problem that locations of the air bubbles are not plated. The configuration of the above embodiment, however, performs a plating process in such a state that the contact locations between the substrate and the contacts are covered with the covering liquid. This configuration does not require the contact area of the substrate to be dried prior to plating and suppresses or prevents the occurrence of a plating failure caused by drying of the pattern on the outer peripheral portion of the substrate.

(2) When the plating process is performed in a state that dirt adheres to the surface of the contact or that the plating solution leaked out from a clearance of a component of the substrate holder adheres to the vicinity of the contact location of the substrate with the contact, the seed layer in the vicinity of the contact location may be dissolved. This is likely to cause a variation in supply of electricity and to lower the in-plane uniformity of the plating film. The configuration of the above embodiment, however, performs a plating process in such a state that the contact locations between the substrate and the contacts are covered with the covering liquid. This configuration suppresses the dirt from adhering to the surface of the contact and/or suppresses the plating solution leaked out from the clearance of the component of the substrate holder from adhering to the contact locations between the substrate and the contacts.

(3) The plating process performed in the state that the contacts are not completely dried (the contacts are half wet) after cleaning of the contacts is likely to damage the seed layer on the substrate. The configuration of the above embodiment, however, performs a plating process in such a state that the contact locations between the substrate and the contacts are covered with the covering liquid. This configuration suppresses or prevents the plating process from being performed in the state that the contacts are not fully dried and suppresses or prevents the seed layer on the substrate from being damaged.

(4) The configuration of the above embodiment does not drip off water from the contacts after cleaning of the contacts but uses the cleaning liquid (for example, pure water) having the electric conductivity controlled to be not greater than the reference value, as the covering water for subsequent substrate processing. This configuration saves the effort of drying the contacts and suppresses or prevents the contacts and the substrate in the half wet state from being subjected to the plating process and thereby suppresses or prevents the seed layer of the substrate from being damaged.

(5) The configuration of the above embodiment performs the plating process in the state that the contact locations between the substrate and the contacts are covered with pure water and does not dry the contact area of the substrate wetted by the pre-process, until completion of the plating process. Drying the contact area of the substrate may cause water to be drained even from peripheral openings of the pattern and cause air bubbles to remain in the openings of the pattern in the course of plating, so as to cause a problem that locations of the air bubbles are not plated. The configuration of the embodiment suppresses or prevents the occurrence of such a problem. The configuration of the embodiment also suppresses or prevents the surface of the seed layer in the half-dried contact area of the substrate from being oxidized and causing a conduction failure.

(6) The configuration of the above embodiment performs the plating process of the substrate in the state that the contact locations between the substrate and the contacts are covered with the covering water having the electric conductivity controlled to be lower than the predetermined reference value. This configuration suppresses or prevents the seed layer in the vicinity of the contact locations from being dissolved by the shunt current flowing through the liquid at locations other than the contact locations. This accordingly suppresses or prevents a variation in supply of electricity caused by dissolution of the seed layer.

(7) The configuration of the above embodiment performs the plating process in the state that the contact locations between the substrate and the contacts are covered with a predetermined volume of pure water and are kept distant from the gas-liquid interface by not shorter than a predetermined distance. This configuration suppresses or prevents the seed layer in the vicinity of the contact locations from being dissolved by the local cell effect due to the concentration of dissolved oxygen in the covering water. This accordingly suppresses or prevents a variation in supply of electricity caused by dissolution of the seed layer.

(8) The configuration of the above embodiment does not require any special structure of the substrate holder or its periphery for covering the contact locations between the contacts and the substrate with the liquid. This configuration accordingly enables the contact locations between the contacts and the substrate to be covered with the liquid by the simple structure without requiring a need to change at all or to substantially change the structure of the substrate holder. Furthermore, the configuration of the embodiment cleans the contacts of the substrate holder on every occasion of the plating process of each substrate and thus constantly keeps the contacts clean.

At least the following aspects are provided from the above description of the embodiments. The method of plating of the above aspect performs the plating process in the state that the contact location between the substrate and the contact is covered with the covering liquid. This configuration does not require a contact area of the substrate to be dried prior to plating and suppresses or prevents a pattern on an outer peripheral portion of the substrate from being dried and causing a plating failure.

The method of plating of the above aspect performs the plating process in the state that the contact location between the substrate and the contact is covered with the covering liquid. This configuration suppresses the dirt from adhering to the surface of the contact and/or suppresses the plating solution leaked out from a clearance of a component of the substrate holder from adhering to the contact location between the substrate and the contact.

The method of plating of the above aspect performs the plating process in the state that the contact location between the substrate and the contact is covered with the covering liquid. This configuration suppresses or prevents the plating process from being performed in a state that the contact is not fully dried and suppresses or prevents a seed layer on the substrate from being damaged.

The method of plating of the above aspect suppresses deterioration of the seed layer on the substrate by a simple configuration without requiring a need to change the structure or the substrate holder or to significantly change the structure of the substrate holder.

The method of plating of this aspect processes the substrate by the plating process in the state that the contact location between the substrate and the contact is covered with the covering liquid having the electric conductivity controlled to be a low value. This configuration suppresses or prevents the seed layer in the vicinity of the contact location from being dissolved by shunt current flowing through the liquid at a location other than the contact location. This accordingly suppresses or prevents a variation in supply of electricity caused by dissolution of the seed layer.

The method of plating of this aspect does not drip off the liquid from the contact after cleaning of the contact but uses the cleaning liquid (pure water, deaerated water or another liquid) having the electric conductivity controlled to be not greater than the reference value, as the covering liquid to cover the contact location between the contact and the substrate for subsequent substrate processing. This configuration saves the effort of drying the contact and suppresses or prevents the contact and the substrate in the half wet state from being subjected to the plating process and thereby suppresses or prevents the seed layer of the substrate from being damaged. Moreover, the method of plating of this aspect does not require any special structure of the substrate holder or its periphery for covering the contact location between the contact and the substrate with the liquid. This configuration accordingly enables the contact location between the contact and the substrate to be covered with the liquid by the simple structure without requiring a need to change at all or to substantially change the structure of the substrate holder. Furthermore, this configuration cleans the contact of the substrate holder on every occasion of the plating process of each substrate and thus constantly keeps the contact clean.

The method of plating of this aspect leaves the predetermined or larger volume of the liquid around the contact (especially, around a contact portion of the contact) and uses the remaining liquid as the covering liquid. This configuration enables the plating process to be performed in a state that the contact location between the contact and the substrate (the seed layer) is distant away from a gas-liquid interface by a distance of not shorter than a predetermined distance (not shorter than a reference value).

The method of plating of this aspect suppresses or prevents carbon dioxide in the atmosphere from being gradually dissolved into the liquid on the substrate holder with elapse of a time after cleaning of the contact and thereby suppresses or prevents the electric conductivity of the liquid from becoming higher than the reference value.

The method of plating of this aspect performs the plating process in the state that the contact location between the substrate and the contact is kept distant away from the gas-liquid interface by a distance of not shorter than a predetermined value. This configuration keeps the concentration of dissolved oxygen low in the covering liquid in the vicinity of the contact location and suppresses or prevents the seed layer in the vicinity of the contact location from being dissolved by the local cell effect due to the dissolved oxygen. This accordingly suppresses or prevents a variation in supply of electricity caused by dissolution of the seed layer.

The method of plating of this aspect suppresses or prevents a resist pattern on the substrate from being dried and thereby suppresses or prevents the occurrence of a problem that air bubbles remain in the resist pattern in the course of plating and that locations of the air bubbles are not plated.

The method of plating of this aspect wets both the substrate and the substrate holder, prior to the process of holding the substrate by the substrate holder. This configuration ensures that a contact portion between the contact and the seed layer of the substrate is covered with a sufficient volume of the liquid.

The method of plating of this aspect performs the pre-wet process and enables the substrate after removal of air bubbles from a resist pattern of the substrate to be held by the substrate holder. Moreover, the method of plating of this aspect enables the substrate to be wet before being held by the substrate holder.

The method of plating of this aspect cleans the substrate after the plating process with a liquid, for example, pure water or deaerated water, and thereby enables the plating solution adhering to the substrate to be collected. Moreover, the method of plating of this aspect enables the substrate in the wet state to be transferred to a next process and thereby suppresses or prevents particles from adhering to the substrate.

The method of plating of this aspect keeps the substrate wet from a time point when the substrate is carried into the plating module to a time point when the substrate is carried out from the plating module. This configuration suppresses or prevents a pattern on the substrate from being dried and suppresses or prevents the liquid inside of openings of the pattern from being dripped off. This configuration accordingly suppresses or prevents the occurrence of a problem that air bubbles remain in the openings of the pattern in the course of plating and that locations of the air bubbles are not plated. Furthermore, the method of plating of this aspect suppresses or prevents the surface of the seed layer in the half-dried contact area of the substrate from being oxidized and causing a conduction failure. The method of plating of this aspect also keeps the substrate wet and thereby suppresses or prevents particles from adhering to the substrate. Moreover, the method of plating of this aspect does not require any special structure of the substrate holder or its periphery for covering the contact location between the contact and the substrate with the liquid. This configuration accordingly enables the contact location between the contact and the substrate to be covered with the liquid by the simple structure without requiring a need to change at all or to substantially change the structure of the substrate holder. Furthermore, this configuration cleans the contact of the substrate holder on every occasion of the plating process of each substrate and thus constantly keeps the contact clean.

According to one aspect, there is provided an apparatus for plating, comprising: a substrate holder configured to hold a substrate and provided with a contact configured to supply electricity to the substrate and a sealing member configured to seal between the substrate and the substrate holder and to form a sealed space in the substrate holder to protect the contact from a plating solution; a plating tank configured to process the substrate held by the substrate holder by a plating process; a cleaning nozzle configured to clean the contact of the substrate holder with a liquid; and a control module, wherein the control module brings the substrate into contact with the contact that is cleaned by the cleaning nozzle and that is in a wet state, causes the substrate to be held by the substrate holder, and causes the plating process of the substrate to be performed in a state that a contact location between the substrate and the contact is locally wet with the liquid in the sealed space.

Although the embodiments of the present invention have been described based on some examples, the embodiments of the invention described above are presented to facilitate understanding of the present invention, and do not limit the present invention. The present invention can be altered and improved without departing from the subject matter of the present invention, and it is needless to say that the present invention includes equivalents thereof. In addition, it is possible to arbitrarily combine or omit the embodiments and the modifications described above and it is also possible to arbitrarily combine or omit respective constituent elements described in the claims and the specification in a range where at least a part of the above-mentioned problem can be solved or a range where at least a part of the effect is exhibited.

The entire disclosure of Japanese Unexamined Patent Publication No. 2004-225089 (Patent Document 1) and Japanese Unexamined Patent Publication No. 2003-27288 (Patent Document 2), including the specification, claims, drawings and abstract is incorporated herein by reference in its entirety.

REFERENCE SIGNS LIST 10 plating tank
20 overflow tank
16 anode 17 resistor body
30 substrate holder
31 first holding member
32 second holding member
33 sealed space
40 rotating mechanism
41 rotating shaft
45 tilting mechanism
46 lifting mechanism
47 support shaft
50 contact
55 sealing member
55A lip portion
60 cleaning liquid (pure water)
100 load port
110 transfer robot
120 aligner
200 pre-wet module
300 pre-soak module
400 plating module
500 cleaning module
600 spin rinse dryer
700 transfer device
800 control module
801 CPU
802 storage portion
1000 plating apparatus
Wf substrate
Wfa lower face
Sd seed layer
Ps plating solution

The invention claimed is:

1. A method of plating, comprising:
holding a substrate by a substrate holder, the process comprising forming a sealed space to protect a contact provided to supply electricity to the substrate, from a plating solution while the substrate holder holds the substrate, causing the substrate to come into contact with the contact cleaned and covered with a liquid having electric conductivity controlled to be lower than a predetermined reference value, and locally covering a contact location between the substrate and the contact with the liquid in the sealed space;
soaking the substrate held by the substrate holder in the plating solution and placing the substrate to be opposed to an anode; and
performing a plating process on the substrate by supplying electric current between the substrate and the anode, wherein the contact location between the substrate and the contact is covered with the liquid during the plating process, cleaning the contact by supplying liquid from a cleaning nozzle to the contact, the contact being disposed in a recess of the substrate holder, wherein, after cleaning, the liquid remains around the contact in an amount equal to or greater than a predetermined amount, and wherein the cleaning nozzle is a component separate from the substrate holder.

2. The method of plating according to claim 1, further comprising:
prior to holding the substrate by the substrate holder, cleaning the contact of the substrate holder with the liquid until electric conductivity of the liquid used for cleaning becomes lower than a predetermined reference value and covering the contact with the liquid having electric conductivity controlled to be lower than the predetermined reference value.

3. The method of plating according to claim 1,
wherein the contact is cleaned again when a predetermined time period has elapsed before the substrate is held by the substrate holder after cleaning of the contact, and the contact is covered again with the liquid having the electric conductivity controlled to be lower than the predetermined reference value.

4. The method of plating according to claim 1,
wherein the contact location between the substrate and the contact is covered with the liquid, such that a distance from a gas-liquid interface between the liquid and air in the sealed space to the contact location between the substrate and the contact becomes not shorter than a predetermined distance value.

5. The method of plating according to claim 1,
wherein the substrate is wet before being held by the substrate holder.

6. The method of plating according to claim 5, further comprising:
prior to holding the substrate by the substrate holder, causing both the substrate and the contact of the substrate holder to be wet in advance.

7. The method of plating according to claim 5, further comprising:
prior to holding the substrate by the substrate holder, performing a pre-wet process that wets the substrate with a liquid and causes air inside of a pattern formed on a surface of the substrate to be displaced with the liquid.

8. The method of plating according to claim 1, further comprising:
cleaning the substrate after the plating process with a liquid; and
transferring the cleaned substrate in a wet state to a next process.

* * * * *